(12) United States Patent
Chen et al.

(10) Patent No.: US 10,177,106 B2
(45) Date of Patent: Jan. 8, 2019

(54) CONDUCTIVE PAD STRUCTURE FOR HYBRID BONDING AND METHODS OF FORMING SAME

(71) Applicant: Taiwan Semiconductor Manufacturing Company, Ltd., Hsinchu (TW)

(72) Inventors: Sheng-Chau Chen, Tainan (TW); Shih Pei Chou, Tainan (TW); Yen-Chang Chu, Tainan (TW); Cheng-Hsien Chou, Tainan (TW); Chih-Hui Huang, Yongkang (TW); Yeur-Luen Tu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/800,491

(22) Filed: Nov. 1, 2017

(65) Prior Publication Data

US 2018/0068965 A1 Mar. 8, 2018

Related U.S. Application Data

(60) Continuation of application No. 15/228,947, filed on Aug. 4, 2016, now Pat. No. 9,842,816, which is a
(Continued)

(51) Int. Cl.
*H01L 23/00* (2006.01)
*H01L 21/324* (2006.01)
(Continued)

(52) U.S. Cl.
CPC ........ *H01L 24/08* (2013.01); *H01L 21/31144* (2013.01); *H01L 21/324* (2013.01); *H01L 21/3212* (2013.01); *H01L 24/02* (2013.01); *H01L 24/03* (2013.01); *H01L 24/05* (2013.01); *H01L 24/80* (2013.01); *H01L 25/0657* (2013.01); *H01L 27/1464* (2013.01);
(Continued)

(58) Field of Classification Search
CPC ......... H01L 24/08; H01L 24/02; H01L 24/03; H01L 24/05; H01L 24/80; H01L 21/31144; H01L 21/3212; H01L 21/324; H01L 25/0657; H01L 27/14634; H01L 27/1464; H01L 27/1469
See application file for complete search history.

(56) References Cited

U.S. PATENT DOCUMENTS 3,691,627 A 9/1972 Engeler
5,940,731 A 8/1999 Wu
(Continued)

OTHER PUBLICATIONS

Kim, N.-H. et al., "Capability of Prevention of Fluorine Penetration for SRO and SiN Capping Films," Journal of the Korean Physical Society, vol. 45, Dec. 2004, pp. S836-S839.

Primary Examiner — Sitaramarao S Yechuri
(74) Attorney, Agent, or Firm — Slater Matsil, LLP

(57) ABSTRACT

A representative device includes a patterned opening through a layer at a surface of a device die. A liner is disposed on sidewalls of the opening and the device die is patterned to extend the opening further into the device die. After patterning, the liner is removed. A conductive pad is formed in the device die by filling the opening with a conductive material.

20 Claims, 7 Drawing Sheets

Related U.S. Application Data division of application No. 14/133,328, filed on Dec. 18, 2013, now Pat. No. 9,437,572.

(51) Int. Cl.
| | |
|---|---|
| *H01L 27/146* | (2006.01) |
| *H01L 21/311* | (2006.01) |
| *H01L 21/321* | (2006.01) |
| *H01L 25/065* | (2006.01) |

(52) U.S. Cl.
CPC .... *H01L 27/1469* (2013.01); *H01L 27/14634* (2013.01); *H01L 2224/0235* (2013.01); *H01L 2224/02321* (2013.01); *H01L 2224/039* (2013.01); *H01L 2224/0345* (2013.01); *H01L 2224/03452* (2013.01); *H01L 2224/03462* (2013.01); *H01L 2224/03614* (2013.01); *H01L 2224/03845* (2013.01); *H01L 2224/05553* (2013.01); *H01L 2224/05554* (2013.01); *H01L 2224/05555* (2013.01); *H01L 2224/05556* (2013.01); *H01L 2224/05557* (2013.01); *H01L 2224/05559* (2013.01); *H01L 2224/05569* (2013.01); *H01L 2224/05576* (2013.01); *H01L 2224/05647* (2013.01); *H01L 2224/05687* (2013.01); *H01L 2224/08057* (2013.01); *H01L 2224/08145* (2013.01); *H01L 2224/08147* (2013.01); *H01L 2224/80011* (2013.01); *H01L 2224/80013* (2013.01); *H01L 2224/80121* (2013.01); *H01L 2224/80895* (2013.01); *H01L 2224/80896* (2013.01); *H01L 2224/80906* (2013.01); *H01L 2224/80948* (2013.01); *H01L 2225/06513* (2013.01); *H01L 2225/06527* (2013.01); *H01L 2225/06541* (2013.01); *H01L 2924/059* (2013.01); *H01L 2924/05042* (2013.01); *H01L 2924/05442* (2013.01)

(56) References Cited

U.S. PATENT DOCUMENTS

| | | | |
|---|---|---|---|
| 6,461,887 | B1 | 10/2002 | Pradeep et al. |
| 8,159,060 | B2 | 4/2012 | Barth et al. |
| 9,040,385 | B2 | 5/2015 | Chen et al. |
| 2001/0039114 | A1 | 11/2001 | Nakamura |
| 2002/0074670 | A1* | 6/2002 | Suga ................. H01L 21/768 257/777 |
| 2003/0157748 | A1* | 8/2003 | Kim ................. H01L 21/76804 438/107 |
| 2007/0001306 | A1 | 1/2007 | Su et al. |
| 2007/0096263 | A1* | 5/2007 | Furukawa ........ H01L 21/76898 257/621 |
| 2008/0020581 | A1 | 1/2008 | Liu |
| 2008/0174017 | A1 | 7/2008 | Yang et al. |
| 2008/0296697 | A1* | 12/2008 | Hsu ................. H01L 23/49827 257/379 |
| 2009/0142922 | A1 | 6/2009 | Kim |
| 2009/0163021 | A1 | 6/2009 | Ryu |
| 2010/0144094 | A1* | 6/2010 | Chen ................. H01L 21/76898 438/109 |
| 2010/0167524 | A1 | 7/2010 | Jung |
| 2010/0323514 | A1 | 12/2010 | Isobayashi et al. |
| 2011/0042814 | A1* | 2/2011 | Okuyama ............. H01L 24/06 257/758 |
| 2011/0175215 | A1 | 7/2011 | Farooq et al. |
| 2012/0100657 | A1 | 4/2012 | DiCioccio et al. |
| 2012/0112322 | A1 | 5/2012 | Lin et al. |
| 2012/0187576 | A1 | 7/2012 | Yu et al. |
| 2013/0009321 | A1 | 1/2013 | Kagawa et al. |
| 2014/0175655 | A1 | 6/2014 | Chen et al. |
| 2015/0171050 | A1 | 6/2015 | Chen |

\* cited by examiner

CONDUCTIVE PAD STRUCTURE FOR HYBRID BONDING AND METHODS OF FORMING SAME

PRIORITY CLAIM AND CROSS-REFERENCE

This application is a continuation of U.S. patent application Ser. No. 15/228,947, filed on Aug. 4, 2016, entitled "Conductive Pad Structure for Hybrid Bonding and Methods of Forming Same," which is a divisional of U.S. patent application Ser. No. 14/133,328, filed on Dec. 18, 2013, now U.S. Pat. No. 9,437,572, issued on Sep. 6, 2016, entitled "Conductive Pad Structure for Hybrid Bonding and Methods of Forming Same," which applications are hereby incorporated by reference.

TECHNICAL FIELD

The present invention relates generally to bonding, and, in particular embodiments, a conductive pad structure for hybrid bonding and methods of forming same.

BACKGROUND

Typically, in a semiconductor device, various electronic components (e.g., transistors, diodes, resistors, capacitors, and the like) are formed in device dies on a wafer. These device dies may then be sawed and bonded to other device dies to form functional devices. For example, in image sensing technologies, a complementary metal-oxide semiconductor (CMOS) image sensor (CIS) may include pixel arrays (e.g., connected to photo diodes) formed on one device die, and logical control circuits may be formed on another device die. These separate dies may be bonded together using a hybrid bonding process to form a functional device. Hybrid bonding is also used in other applications to form three dimensional integrated circuits (3DICs) where multiple dies are stacked on one another.

In hybrid bonding, conductive pads on a top surface of one die may be directly bonded to conductive pads on a top surface of the other die, for example, using fusion bonding and annealing processes. However, as a result of the annealing process, the material of the conductive pads may be stretched (e.g., as a result of increased ductility) and voids may be formed between the bonded conductive pads, especially in the corner regions.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A conductive pad structure for hybrid bonding and the method of forming the same are provided in accordance with an embodiment. The intermediate stages of manufacturing an embodiment are illustrated. The variations of the embodiments are then discussed.

Embodiments will be described with respect to a specific context, namely hybrid bonding of stacked device dies for image sensing. Other embodiments may also be applied, however, to other applications of bonding device dies such as in 3DIC packages.

Figure 1:
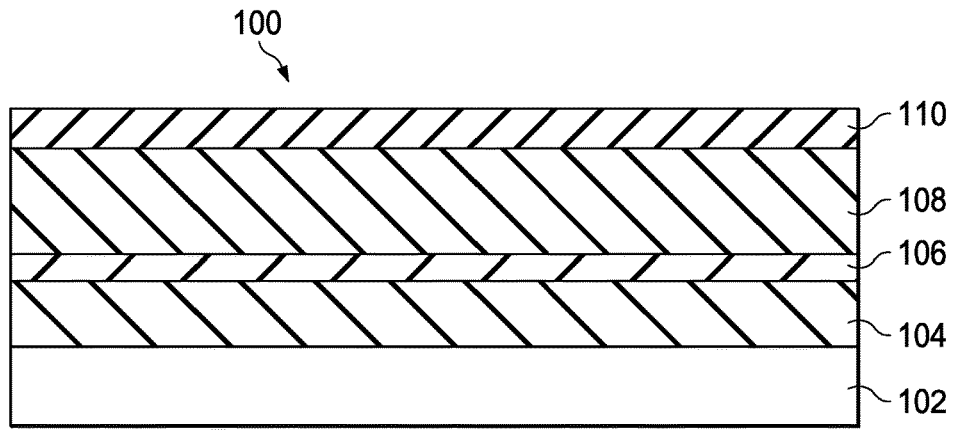
FIG. 1 illustrates a cross-sectional view of a device die in accordance with various embodiments.

FIGS. 1 through 9 illustrate cross-sectional views of intermediary steps of forming a conductive pad for hybrid bonding in accordance with various embodiments. FIG. 1 illustrates a cross-sectional view of a portion of a first device die 100. In image sensing technologies, first device die 100 may include photodiodes interconnected to form a pixel array. First device die 100 includes a substrate 102, which may be a bulk silicon substrate although other semiconductor materials including group III, group IV, and group V elements may also be used. Alternatively, substrate 102 may be a silicon-on-insulator (SOI) substrate. Active devices (not shown) such as transistors and photodiodes may be formed on the top surface of substrate 102.

First device die 100 further includes interconnect layers 104 formed over substrate 102. Interconnect layers 104 may include an inter-layer dielectric (ILD) and/or inter-metal dielectric layers (IMD) containing conductive features (e.g., metal lines and vias, not shown) formed over substrate 102 using any suitable method. Interconnect layers 104 may connect various active devices in substrate 102 to form functional circuits. The ILD/IMDs may comprise low-k dielectric materials having k values, for example, lower than about 4.0 or even 2.8. In some embodiments, interconnect layers 104 may comprise un-doped silicate glass (USG), and the like. Interconnect layers 104 may have a thickness of about 2200 Å although the actual dimensions of interconnect layers 104 may vary depending on layout design.

An isolation layer 106 may be formed over interconnect layers 104. Isolation layer 106 may comprise silicon nitride, silicon oxide, or the like. Isolation layer 106 may have a thickness of about 500 Å, although the actual dimension isolation layer 106 may vary depending on layout design.

Redistribution layers (RDLs) 108 may be formed over isolation layer 106. RDLs 108 may comprise polymer layers or dielectric layers (e.g., comprising USG) having interconnect structures (e.g., metal lines and vias) that route the electrical circuits formed in interconnect layers 104 to desired locations in first device die 100. RDLs 108 may have a thickness of about 3000 Å, although the actual dimensions RDLs 108 may vary depending on layout design.

An oxide layer 110 is formed on a top surface of first device die 100. Oxide layer 110 may comprise silicon oxynitride (SiON), $SiO_2$, SiN, SiC, or the like. Oxide layer 110 may have a thickness of about 3000 Å and may be used as a bonding interface layer for bonding first device die 100 to another device die during a subsequent hybrid bonding process (described further herein in FIGS. 8 and 9). Although oxide layer 110 is described herein as an oxide layer, any interfacial layer suitable for direct bonding to another interfacial layer (e.g., through fusion bonding) may be used in alternative embodiments in lieu of an oxide.

Figure 2:
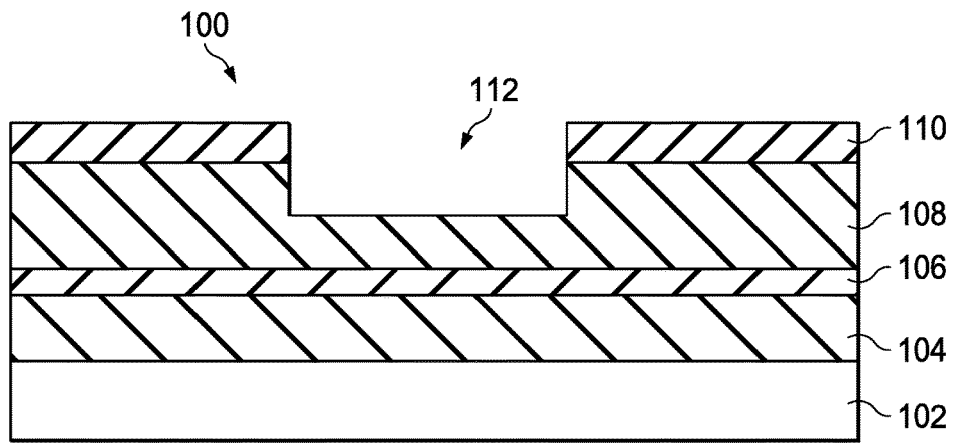
FIG. 2 illustrates a cross-sectional view of patterning an opening in the device die in accordance with various embodiments.

FIG. 2 illustrates the patterning of first device die 100 to form an opening 112 for a conductive pad. First device die 100 may be patterned, for example, using a combination of photolithography and etching. While FIG. 2 illustrates opening 112 extending through oxide layer 110 into RDLs 108, the layers of first device die 100 that are patterned for opening 112 may vary depending on a desired depth of opening 112. For example, opening 112 may have a depth from a top surface of first device die 100 of between about 0.1 μm and about 1 μm.

Figure 3:
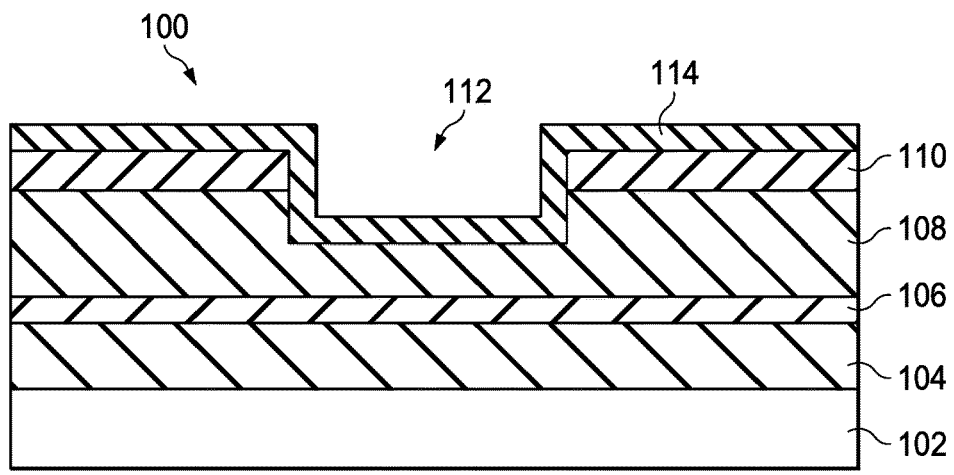
FIG. 3 illustrates a cross-sectional view of forming a liner over the device die and in the opening in accordance with various embodiments.

FIG. 3 illustrates the formation of a liner 114 over oxide layer 110 and covering sidewalls and a bottom surface of opening 112. Liner 114 may be deposited using any conformal deposition method such as chemical vapor deposition (CVD), or the like. Liner 114 may comprise silicon nitride, titanium nitride, titanium oxide, or any material that may be removed at a greater rate than oxide layer 110 and RDLs 108. In various embodiments, liner 114 may be between about 300 Å and about 1000 Å or more thick.

Figure 4:
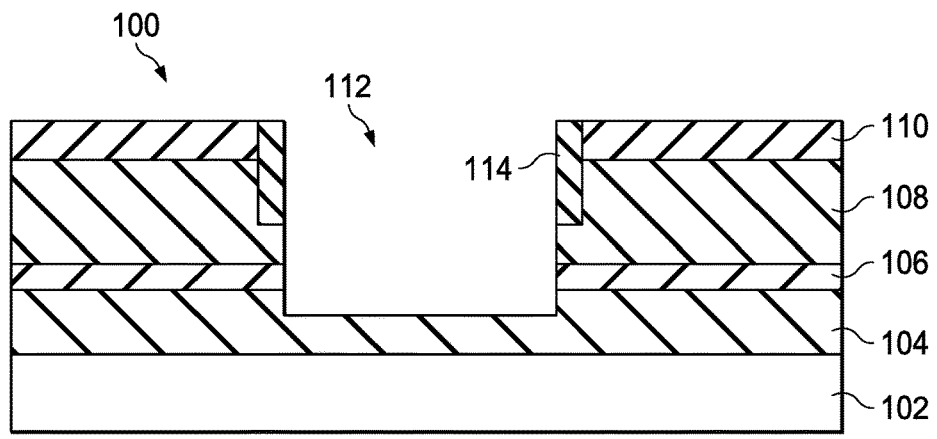
FIG. 4 illustrates a cross-sectional view of extending the opening further into the device die in accordance with various embodiments.

FIG. 4 illustrates another patterning of first device die 100 to extend opening 112 further into first device die 100. This second patterning may be achieved, for example, using an anisotropic etching process so that the vertical dimension of opening 112 is increased without substantially increasing the horizontal dimensions of opening 112. As a result of the patterning, lateral portions of liner 114 (e.g., covering oxide layer 110 and bottom surfaces of opening 112) may be removed. That is, a top surface of oxide layer 110 may be exposed. Vertical portions of liner 114 (e.g., on sidewalls of opening 112) may remain in first device die 100. After the second patterning, liner 114 may only partially cover sidewalls of opening 112. Furthermore, as a result of the patterning, oxide layer 110 may be thinned. For example, in embodiments where oxide layer 110 was deposited to have a thickness of about 5000 Å, after the patterning, oxide layer 110 may have a thickness of about 2500 Å. Furthermore, because the etching rate of liner 114 may be greater than the etching rate of oxide layer 110, less oxide layer 110 may be removed than liner 114 during etching. Thus, a top surface of oxide layer 110 may or may not be substantially level with a top surface of liner 114.

While FIG. 4 illustrates opening 112 extending through oxide layer 110, RDLs 108, and isolation layer 106 into interconnect layers 104, the layers of first device die 100 that are patterned to extend opening 112 may vary depending on a desired depth of opening 112. For example, opening 112 may have a depth from a top surface of first device die 100 after expansion of between about 0.2 μm and about 2 μm.

Figure 5:
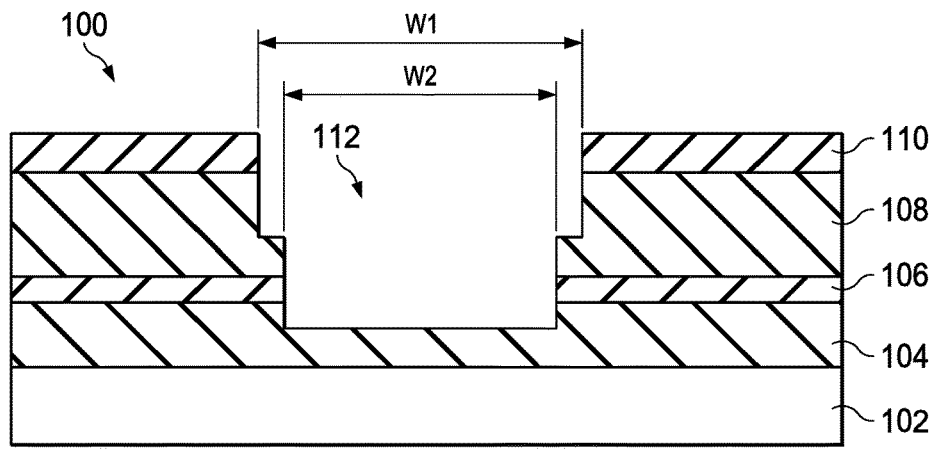
FIG. 5 illustrates a cross-sectional view of removing the liner from the device die in accordance with various embodiments.

In FIG. 5, remaining portions of liner 114 are selectively removed using any suitable method, such as an etching process using a chemical etchant that etches liner 114 at a faster rate than device layers contacting liner 114 (e.g., oxide layer 110 and RDLs 108). For example, a solution of 85% phosphoric acid ($H_3PO_4$) may be used when liner 114 comprises SiN, oxide layer 110 comprises SiON, and RDLs 108 comprise USG. The exact chemistry used during etching may vary depending on the materials used to form the applicable device layers in first device die 100. In various embodiments, a ratio of removal rates of liner 114 to oxide layer 110 to RDLs 108 may be about 60 to 30 to 1. Furthermore, because oxide layer 110 may have a higher removal rate than RDLs 108, sidewalls of oxide layer 110 may or may not be vertically aligned with sidewalls of RDLs 108 in opening 112.

As a result of removing liner 114, a top portion of opening 112 has a horizontal dimension W1 that is larger than a horizontal dimension W2 of a bottom portion of opening 112. Horizontal dimensions W1 and W2 may be a length/width, diameter, or the like depending on a top down shape of opening 112. In various embodiments, horizontal dimensions W1 and W2 may be between about 0.1 μm and 10 μm. A difference in dimension between W1 and W2 may depend on the thickness of liner 114. For example, in embodiments where liner 114 was about 500 Å thick, W1 may be about 0.1 μm larger than W2. Generally, a difference between W1 and W2 may be at least about 0.05 μm.

Figure 6:
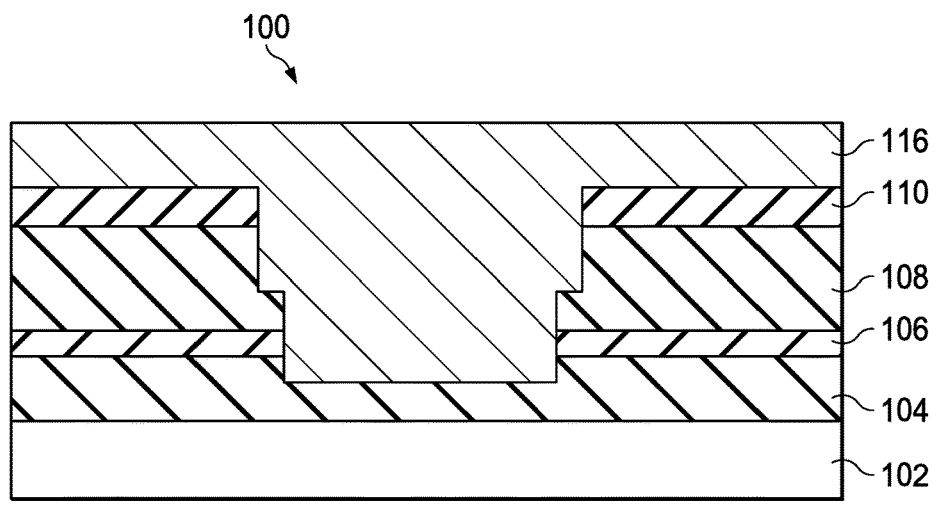
FIG. 6 illustrates a cross-sectional view of filling the opening in the device die with a conductive material in accordance with various embodiments.

FIG. 6 illustrates the filling of opening 112 with a conductive material 116, for example, copper or a copper alloy. The filling of opening 112 may include an electro-chemical plating (ECP) process. Conductive material 116 may overflow opening 112 and cover a top surface of oxide layer 110. In various embodiments, a barrier layer (not shown) and/or a seed layer (not shown) may be formed, for example, using physical vapor deposition, CVD, or the like in opening 112 prior to the filling of opening 112 with conductive material 116.

Figure 7:
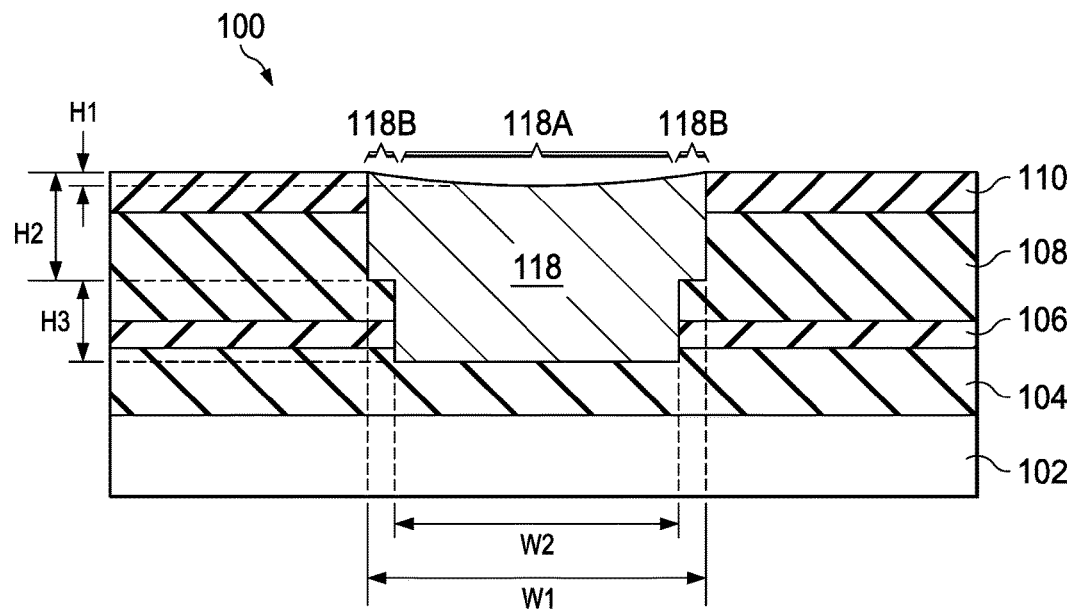
FIG. 7 illustrates planarizing a surface of the device die in accordance with various embodiments.

Subsequently, as illustrated by FIG. 7, a planarization (e.g., a chemical mechanical polish (CMP)) may be performed to remove overflow portions of conductive material 116 to form conductive pad 118 in first device die 100. The planarization may result in the dishing of conductive pad 118 (i.e., a top surface of conductive pad 118 may be non-planar and concave). This dishing may be intentional to allow room for conductive pad 118 to expand in a subsequent annealing process. The dishing may remove a depth H1 of conductive pad 118, and the planarization process may be controlled so that depth H1 is less than about 50 Å to ensure proper bonding of first device die 100 to another device die.

As a result of the process steps illustrated by FIGS. 1 through 7, conductive pad 118 is formed in first device die 100. Additionally, in an embodiment, conductive pad 118 is formed of a single continuous material (e.g., copper) having no internal interfaces formed therein. Conductive pad 118 is shaped to include a top portion having a horizontal dimension W1 and a vertical dimension H2. Conductive pad 118 further includes a bottom portion having a horizontal dimension W2 and a vertical dimension H3. In various embodiments, horizontal dimension W1 is larger than horizontal dimension W2. Horizontal dimensions W1 and W2 may be between about 0.1 µm and about 10 µm. Horizontal dimensions W1 and W2 may be a length/width, diameter, or the like depending on a top-down shape of conductive pad 118. Centerlines of the top and bottom portions may be vertically aligned.

In a top down view, conductive pad 118 may have any shape such as a square, rectangle, circle, oval, or the like. Furthermore, vertical dimensions H1 and H2 of the top and bottom portions of conductive pad 118, respectively, may or may not be equal, and vertical dimensions H1 and H2 may be between about 0.1 µm and about 1 µm.

Thus, as illustrated by FIG. 7, the shape of conductive pad 118 provides for additional metallic material in center regions 118A of conductive pad 118 compared to corner regions 118B of conductive pad 118. This shape of conductive pad 118 reduces the overall surface stress of conductive pad 118. For example, in simulations where conductive pad 118 comprises copper and the dimensions of W1, W2, H2, and H3 are 1 µm, 0.5 µm, 0.5 µm, and 1 µm, respectively, the thermal stress at the surface of conductive pad 118 is $4.938 \times 10^{-5}$ Newtons. However, in simulations where the dimensions of W1, W2, H2, and H3 were 1 µm, 0 µm, 0.5 µm, and 0 µm, respectively, (e.g., where the metallic material was uniformly distributed), the surface stress of the conductive pad was higher at $5.977 \times 10^{-5}$ Newtons. The reduction of surface stress reduces the probability of forming voids, particularly in corner regions 118B, during subsequent bonding processes. Although FIG. 7 only illustrates first device die 100 having a single conductive pad 118, first device die 100 may include multiple conductive pads 118 formed simultaneously.

Figure 8A:
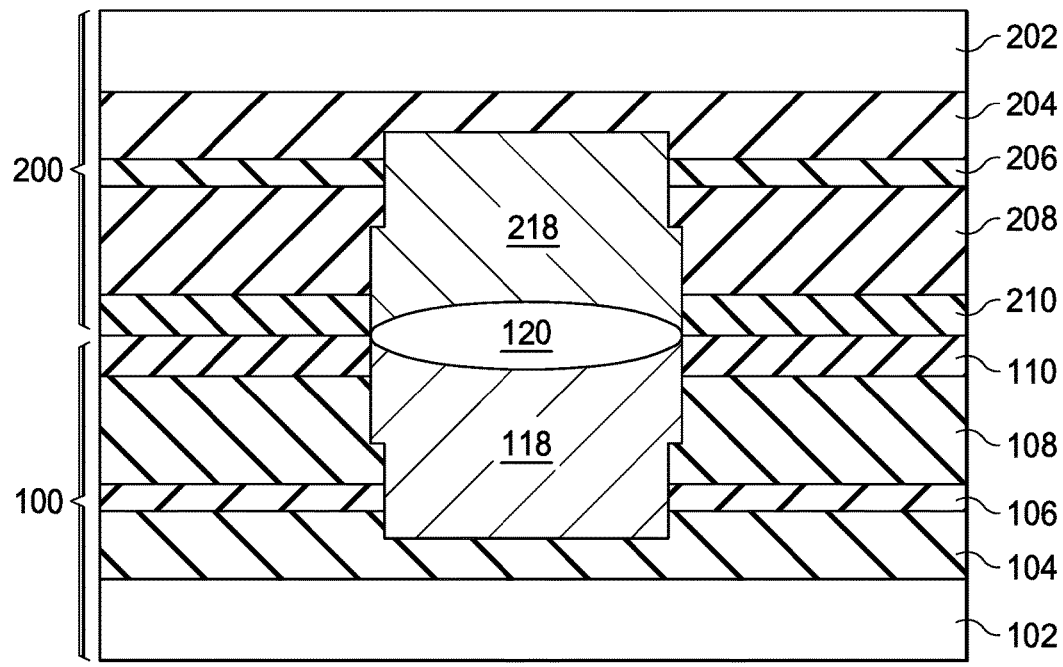
FIG. 8A illustrates bonding an oxide layer of the device die to another oxide layer of another device die in accordance with various embodiments.
Figure 8B:
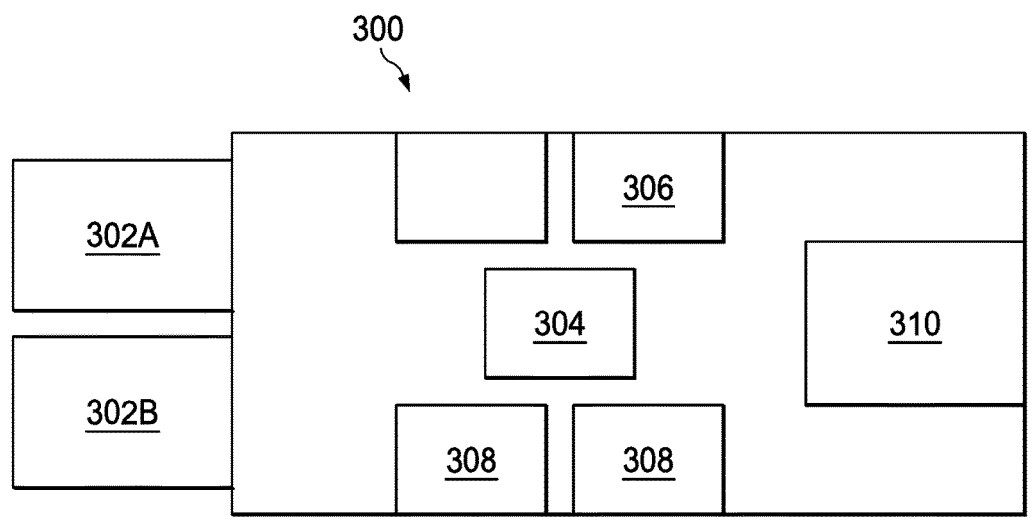
FIG. 8B illustrates a top-down view of a bonding tool, which may be used to bond the device dies in accordance with various embodiments.
Figure 9:
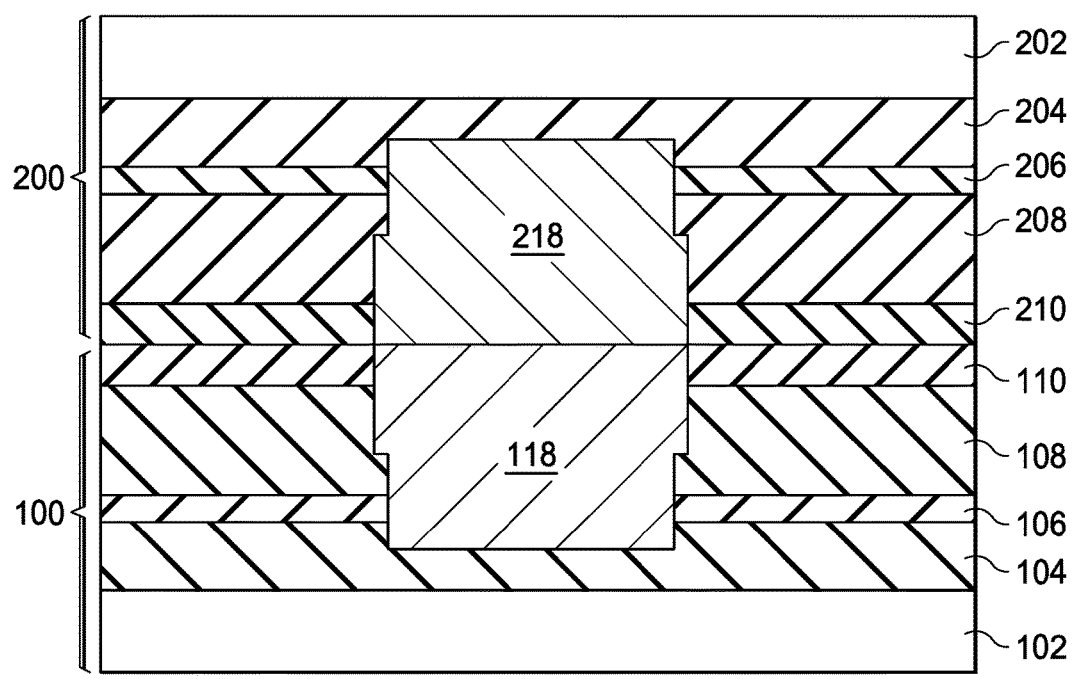
FIG. 9 illustrates bonding conductive pads of the device dies in accordance with various embodiments.

FIGS. 8A through 9 illustrate the bonding of first device die 100 to a second device die 200 through hybrid bonding. In image sensing technologies, second device die 200 may include logical control circuits for controlling the pixel array in first device die 100. Second device die 200 may include a substrate 202 (e.g., having active devices, not shown), interconnect layers 204 (e.g., forming logic control circuits), an isolation layer 206, RDLs 208, and an oxide layer 210. The various layers of second device die 200 may be substantially similar to the layers of first device die 100, and detailed description of these device layers is omitted for brevity. Second device die 200 further includes a conductive pad 218, which may be substantially similar in shape to conductive pad 118.

FIG. 8A illustrates the bonding of oxide layers 110 and 210 using, for example, a fusion bonding process. In various embodiments, the fusion bonding may be done using a bonding tool 300 illustrated in FIG. 8B. The bonding may begin by loading first device die 100 and second device die 200 into load ports 302A and 302B, respectively. A movement module 304 may move first device die 100 to a surface activation module 306. In an embodiment, surface activation module 306 may be a plasma module that exposes the surface of oxide layer 110 to a plasma environment. Alternatively, surface activation module 306 may be a wet cleaning module that performs a wet clean to activate the surface of oxide layer 110. For example, oxide layer 110 may be cleaned using a procedure such as an SC-1 or SC-2 cleaning procedure to form a hydrophilic surface. In yet another alternative, surface activation module 306 may be an etching module that treats the surface of oxide layer 110 to form a hydrophobic surface, for example, using an etching solution of hydrogen fluoride (HF) or ammonium fluoride ($NH_4F$).

Subsequently, movement module 304 may move first device die 100 to a cleaning module 308 to clean the surface of oxide layer 110. Movement module 304 may move first device die 100 to a bonding module 310 to await bonding. Movement module 304 may also move second device die 200 to surface activation module 306. A similar surface activation treatment may be applied to a surface of oxide layer 210 as the treatment applied to oxide layer 110. For example, a plasma treatment, wet cleaning, or etching may be applied to the surface of oxide layer 210 depending on the surface activation process used on oxide layer 110. Subsequently, the movement module 304 may move second device die 200 to cleaning module 308 to clean the surface of oxide layer 210, and second device die 200 may be moved to bonding module 310 for bonding with first device die 100.

Bonding module 310 may include an alignment tool to align oxide layers 110 and 210 of first device die 100 and second device die 200. Oxide layers 110 and 210 are then contacted together to begin the hybrid bonding procedure. At this stage, conductive pads 118 and 218 may not be bonded, and a void 120 may be disposed between conductive pads 118 and 218 due to dishing.

After oxide layer 110 is in contact with oxide layer 210, a thermal annealing process may be utilized to strengthen the bond between oxide layers 110 and 210 and to additionally bond conductive pads 118 and 218 as illustrated by FIG. 9. The annealing process conditions may include increasing the temperature of first and second device dies 100 and 200 from room temperature (e.g., about 20° Celsius (C)) to a suitable annealing temperature (e.g., between about 150° C. and about 400° C.) at a rate of 5° C. per minute. The temperature of first and second device dies 100 and 200 may be maintained at the annealing temperature for about two hours. The annealing process expands the conductive material of conductive pads 118 and 218 to fill void 120, bonding conductive pads 118 and 218 and electrically connecting first and second device dies 100 and 200. As a result of the shape of conductive pads 118 and 218 and reduced surface stress, the bonded conductive pads 118 and 218 may be substantially free of voids. Furthermore, the reduced surface stress may allow for the annealing process to be performed in easier process conditions (e.g., at a lower temperature).

Figure 10:
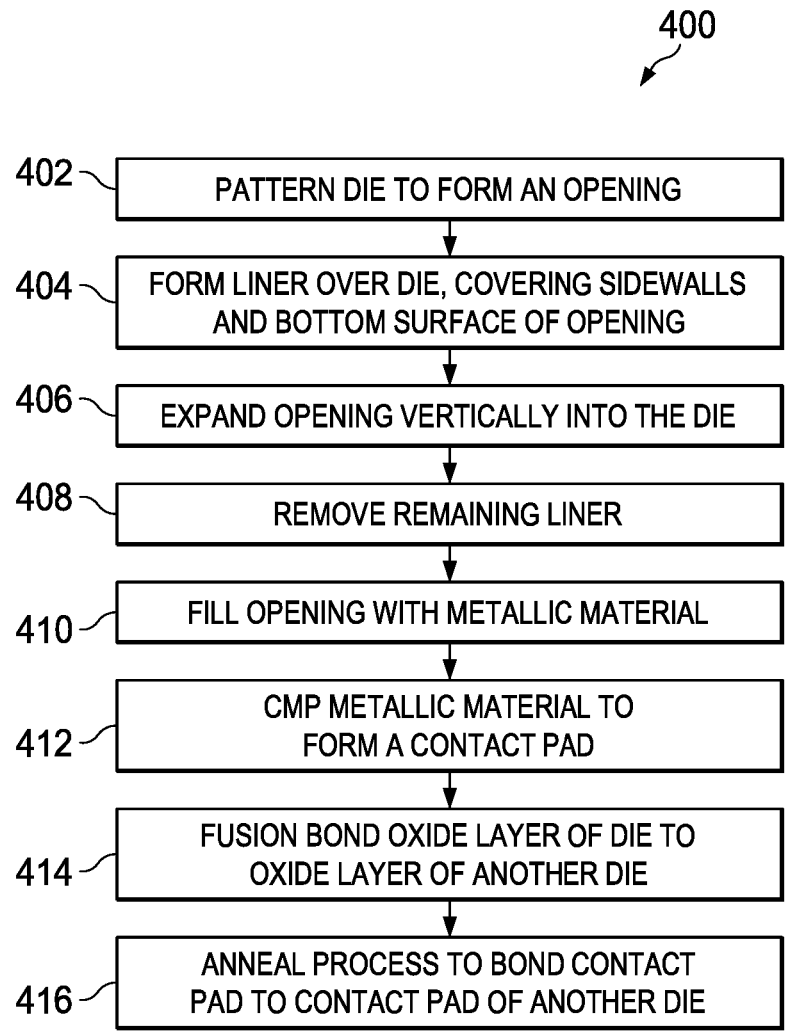
FIG. 10 illustrates a flow chart of a process flow for forming conductive pads and hybrid bonding device dies in accordance with various embodiments.

FIG. 10 illustrates a process flow 400 for hybrid bonding device dies in accordance with various embodiments. In step 402, a die (e.g., first device die 100) is patterned to form an opening. The die may include an oxide layer (e.g., oxide layer 110) at a top surface, which may be used as a bonding interface in hybrid bonding. Next, in step 404, a liner (e.g., liner 114) is formed over the die and covering sidewalls and a bottom surface of the opening. The liner may be formed of any material that may be selectively removed at a greater rate than any layers of first device die 100 in physical contact with the liner.

In step 406, another etching is performed in first device die 100 to expand the opening further into the die, for example, using an anisotropic etching process. The anisotropic etching may not substantially expand the opening in a lateral direction. As a result of the etching, lateral portions of the liner (e.g., covering a top surface of the die and bottom surface of the opening) may be removed. Remaining portions of the liner on sidewalls of the opening may not be removed and may partially cover sidewalls of the expanded opening.

In step 408, the liner is removed, for example by selecting a chemical etchant that selectively removes the liner without significantly removing other portions of the device die. For example, when the liner comprises SiN and the other device layers in contact with the liner comprise SiON and USG, a solution of 85% phosphoric acid may be used to remove the liner. As a result of removing the liner, a top portion of the opening may have a first width that is larger than a second width of a bottom portion of the opening.

In step 410, the opening is filled with a metallic material (e.g., copper). The filling of the metallic material may overflow the opening. Subsequently, in step 412, a CMP may be performed to remove excess metallic material to form a conductive pad. The CMP process may further dish a top surface of the conductive pad (i.e., form a non-planar, concave top surface). This dishing may be intentional to allow expansion room for the conductive pad during a subsequent bonding process. The resulting conductive pad may have a center portions having additional conductive material than corner portions. This shape of the resulting conductive pad reduces the thermal stress on a top surface of the conductive pad.

In step 414, the oxide layer of the die may be bonded (e.g., fusion bonded) to an oxide layer of another device die. The other device die may also have a second conductive pad that is substantially similar, particularly in shape, to the conductive pad formed in steps 402 through 412. The bonding of the oxide layers may not bond the conductive pads, and a void may be defined between the conductive pads due to dishing.

Finally, in step 416, an annealing process is performed to bond the two conductive pads and fill the void. The annealing process may be performed by ramping up the temperature of the bonded dies from room temperature to 300° C. at a rate of 5° C. per minute. The temperature of the bonded dies may be maintained at about 300° C. for about two hours. As a result of the shape of the conductive pads and the reduced thermal stress, the resulting bonded conductive pads may be substantially free of any voids.

Figure 11A:
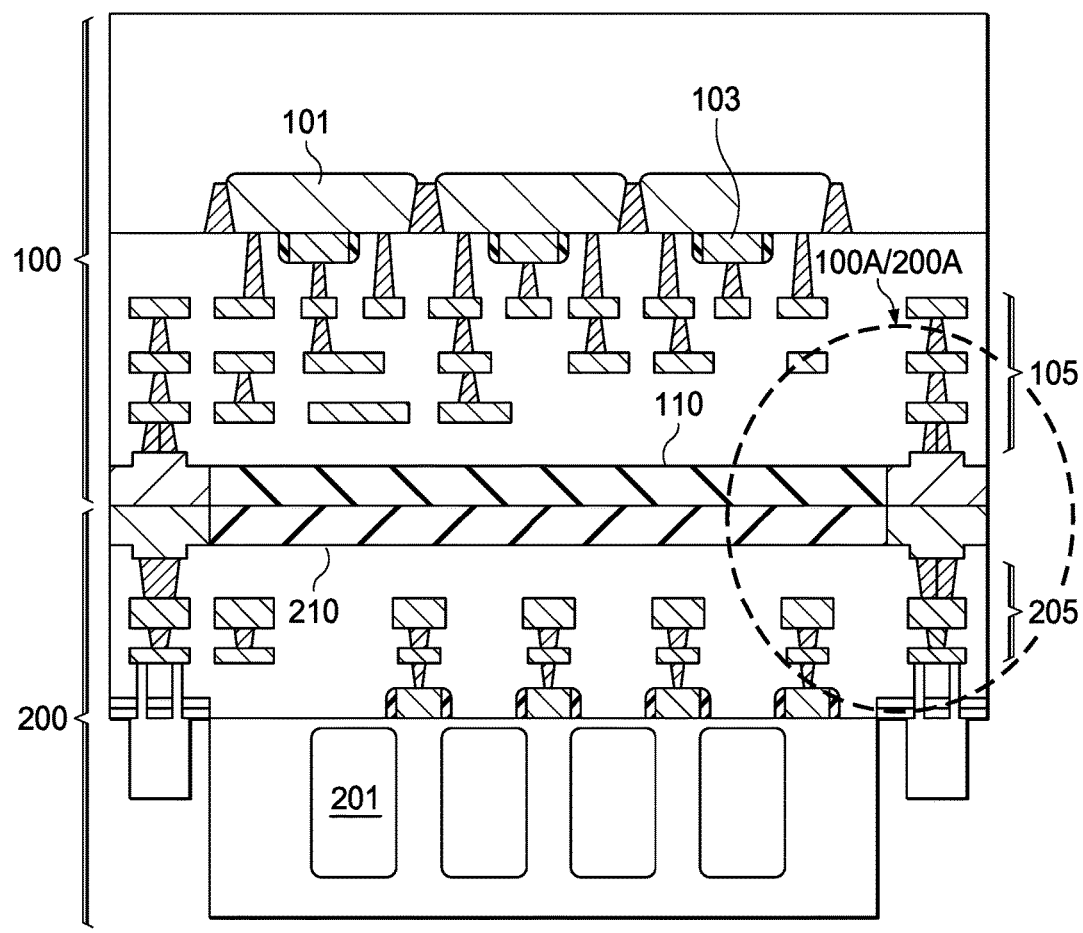
FIGS. 11A through 11C illustrate varying views of a bonded image sensing device in accordance with various embodiments.
Figure 11B:
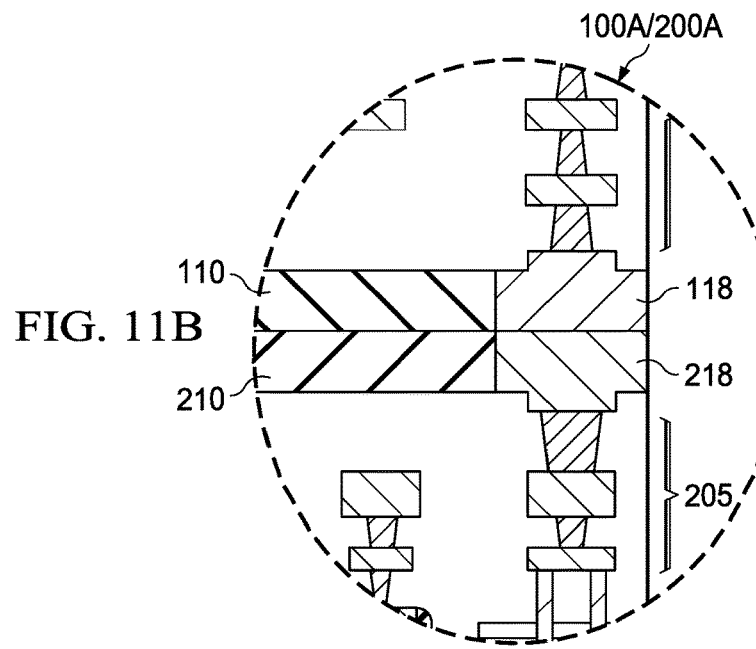
Figure 11C:
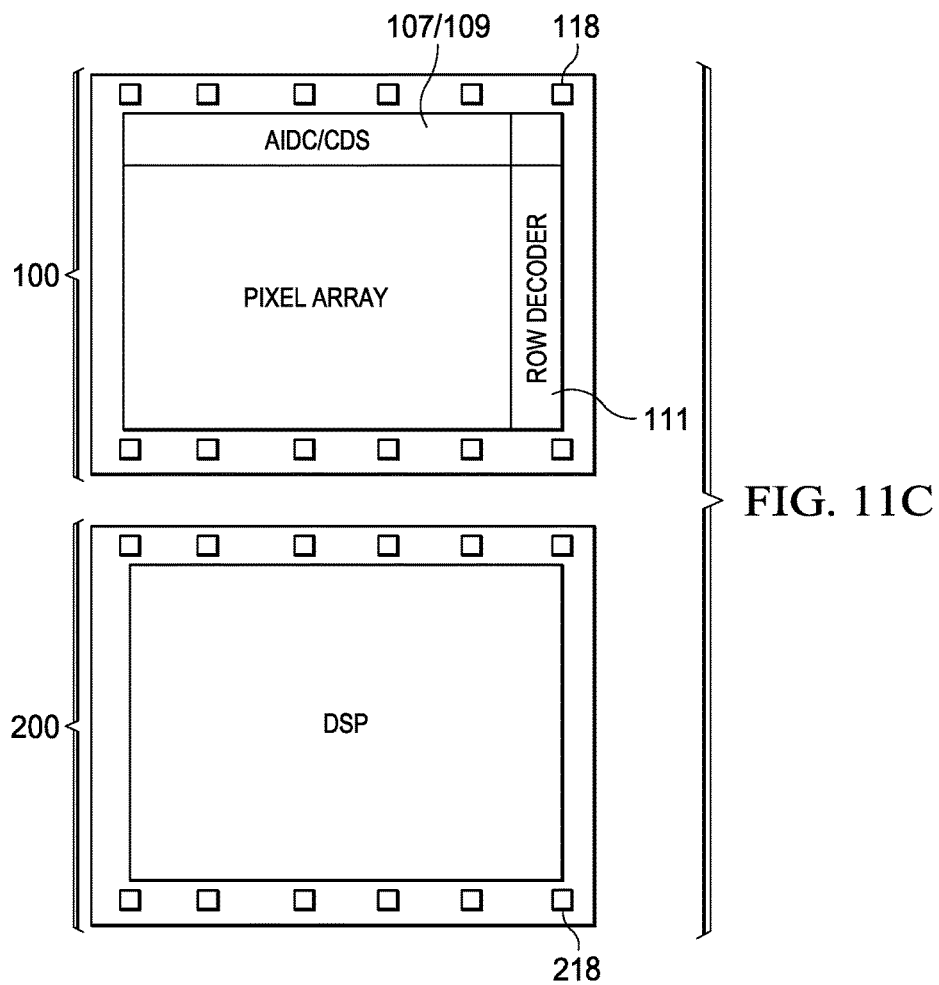

FIGS. 11A through 11C illustrate varying views of a bonded first and second device dies 100 and 200 in an example embodiment where first device die 100 is a CMOS image sensor (CIS) die and second device die 200 is a logic control die. FIG. 11A shows a cross-sectional view, FIG. 11B illustrates an in-depth view of the cross-sectional view of FIG. 11A, and FIG. 11C illustrates a top down view. First device die 100 may include photodiodes 101, transfer transistors 103, and metallization layers 105 (e.g., interconnect layers 104). Metallization layers 105 may electrically connect photodiodes 101 and transfer transistors 103 to form functional circuits. These functional circuits may include a pixel array in a center region of first device die 100 as illustrated by FIG. 11C. The functional circuits of first device die 100 may also include an analogue to digital convertor (ADC) 107, correlated double sampling (CDS) circuits 109, a row decoder 111, and the like. As also illustrated by FIG. 11C, a plurality of conductive pads 118 for bonding may be disposed on peripheral regions of first device die 100.

Second device die 200 may include logic arrays 201 and metallization layers 205 (e.g., interconnect layers 204). The metallization layers may interconnect logic arrays 201 to form digital signal processing circuits (e.g., application specific integrated circuits (ASIC)) that provide control functions for the image sensor formed by first device die 100 and second device dies 200 as also illustrated by FIG. 11C.

A plurality of conductive pads 218 may be located at peripheral regions the top surface of second device die 200.

FIG. 11B illustrates a detailed cross-sectional view of a portion 100A/200A of bonded first and second device dies 100 and 200. Hybrid bonding may be used to bond oxide layer 110 and conductive pads 118 of first device die 100 to oxide layer 210 and conductive pads 218 of second device die 200, respectively. Conductive pads 118 and 218 are shaped so that center portions of conductive pads 118 and 218 are thicker (e.g., has more conductive material) than corner regions of conductive pads 118 and 218. This shape of conductive pads 118 and 218 reduces thermal stress at the interface between conductive pads 118 and 218, which reduces the formation of voids after hybrid bonding.

In accordance with an embodiment, a method includes patterning an opening through a layer at a surface of a device die. The method further includes forming a liner on sidewalls of the opening, patterning the device die to extend the opening further into the device die. After patterning the device die, the liner is removed. A conductive pad is formed in the device die by filling the opening with a conductive material.

In accordance with another embodiment, a method includes etching a first opening through an oxide layer on a surface of a first device die. The first opening has a first horizontal dimension. A liner is formed over the first device die. The liner covers sidewalls and a bottom surface of the first opening. The method further includes etching a second opening connected to the first opening in the first device die by etching through first portions of the liner on the bottom surface of the first opening. The second opening has a second horizontal dimension smaller than the first horizontal dimension. Second portions of the liner on sidewalls of the first opening are removed. A first conductive pad is formed in the first and second openings, and the first device die is bonded to a second device die. The first conductive pad is bonded to a second conductive pad on a surface of the second device die.

In accordance with yet another embodiment, a device includes an oxide layer at a top surface of a device die and a conductive pad in the device die. The conductive pad includes a top portion at the top surface of the first device die having a first horizontal dimension and a bottom portion connected to the top portion with no internal interface between the top portion and the bottom portion. The bottom portion has a second horizontal dimension, and the first horizontal dimension is larger than the second horizontal dimension.

In accordance with a representative embodiment, a device comprises: a first oxide layer at a top surface of a first device die; a first conductive pad in the first device die, wherein the first conductive pad comprises; and a second device die bonded to the first device die. A top portion at the top surface of the first device die has a first lateral dimension, and a bottom portion connected to the top portion, wherein the bottom portion has a second lateral dimension. The first lateral dimension is larger than the second lateral dimension. The second device die comprises: a second oxide layer directly bonded to the first oxide layer; and a second conductive pad directly bonded to the first conductive pad. The second conductive pad may have a substantially same shape as the first conductive pad. The first lateral dimension and the second lateral dimension may be between about 0.1 μm and about 10 μm. A difference between the first lateral dimension and the second lateral dimension may be at least about 0.05 μm. The top portion may have a first vertical dimension and the bottom portion may have a second vertical dimension, wherein the first vertical dimension and the second vertical dimension are between about 0.1 µm and about 1 µm. Centerlines of the top portion and the bottom portion may be vertically aligned. The first oxide layer may comprise silicon oxynitride.

In accordance with another representative embodiment, a device comprises: a first device having an opening through a first layer at a surface of a first device die, wherein the opening extends into the first device die; and a first conductive pad in the first device die, the first conductive pad comprising a conductive material in the opening. The opening comprises: a first portion in the first layer; and a second portion under the first portion, wherein the first portion is wider than the second portion. The first layer may comprise silicon oxynitride. The first conductive pad may comprise a substantially concave top surface. A second layer may comprise silicon oxynitride. A second conductive pad may comprise a substantially concave top surface. The first device die may be hybrid bonded to a second device die, wherein the first layer is fusion bonded to the second layer disposed on a surface of the second device die and the first conductive pad is metal-to-metal bonded to the second conductive pad in the second device die.

In accordance with yet another representative embodiment, a device comprises: a first opening extending through a first dielectric layer at a top surface of a first die. The first opening comprises: a first portion in the first dielectric layer; and a second portion under the first portion, wherein the first portion is wider than the second portion. The device further comprises: a first conductive pad in the first opening; a second die comprising a second conductive pad extending through a second dielectric layer at a top surface of the second die, wherein the first conductive pad is aligned to the second conductive pad; and the first dielectric layer bonded to the second dielectric layer. The second conductive pad comprises a first width in the second dielectric layer and a second width under the second dielectric layer, wherein the first width is greater than the second width. The first conductive pad may be disposed at a peripheral region of the first die, and the second conductive pad may be disposed at a peripheral region of the second die. The first conductive pad and the second conductive pad may have a substantially same shape. A top surface of the first conductive pad may have a dished surface profile. The dished surface profile may have a height difference between the top surface of the first conductive pad and a top surface of the first dielectric layer of less than about 50 Å. The first conductive pad may be electrically coupled to the second conductive pad. At least one of the first dielectric layer or the second dielectric layer may comprise silicon oxynitride.

In accordance with yet another representative embodiment, a device includes: a first substrate; a first redistribution structure over the first substrate; a first dielectric layer over the first redistribution structure; and a first conductive pad extending through the first dielectric layer and the first redistribution structure, a bottommost surface of the first conductive pad being below a bottommost surface of the first redistribution structure. The first conductive pad includes: a first portion extending through the first dielectric layer, the first portion having a first width; and a second portion extending through the first redistribution structure, the second portion having a second width, the second width being different from the first width.

In accordance with yet another representative embodiment, a device includes: a first substrate; a first interconnect structure over the first substrate; a first dielectric layer over the first interconnect structure; and a first conductive pad extending through the first dielectric layer and into the first interconnect structure, a bottommost surface of the first conductive pad being below a topmost surface of the first interconnect structure and above a bottommost surface of the first interconnect structure. The first conductive pad includes: a first portion within the first dielectric layer, the first portion having a first width; and a second portion within the first interconnect structure, the second portion having a second width, the second width being different from the first width.

In accordance with yet another representative embodiment, a device includes: a first substrate; a first interconnect structure over the first substrate; a first redistribution structure over the first interconnect structure; a first dielectric layer over the first redistribution structure; and a first conductive pad extending through the first dielectric layer and the first redistribution structure, and into the first interconnect structure, the first conductive pad narrowing as the first conductive pad extends through the first redistribution structure toward the first interconnect structure.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
   a first substrate having a pixel array region and a peripheral region surrounding the pixel array region;
   a plurality of photodiodes in the pixel array region of the first substrate;
   a first redistribution structure over the first substrate;
   a first dielectric layer over the first redistribution structure; and
   a first conductive pad extending through the first dielectric layer and the first redistribution structure, the first conductive pad being disposed over the peripheral region of the first substrate, a bottommost surface of the first conductive pad being below a bottommost surface of the first redistribution structure, wherein the first conductive pad comprises:
      a first portion extending through the first dielectric layer, the first portion having a first width; and
      a second portion extending through the first redistribution structure, the second portion having a second width, the second width being different from the first width.

2. The device of claim 1, wherein the second width is less than the first width.

3. The device of claim 1, further comprising:
   a second substrate;
   a second redistribution structure interposed between the second substrate and the first dielectric layer;
   a second dielectric layer interposed between the second redistribution structure and the first dielectric layer, the second dielectric layer being in physical contact with first dielectric layer; and
   a second conductive pad extending through the second dielectric layer and the second redistribution structure, the second conductive pad being in physical contact with the first conductive pad.

4. The device of claim 3, wherein a topmost surface of the second conductive pad is above a topmost surface of the second redistribution structure.

5. The device of claim 3, wherein the second conductive pad comprises:
   a third portion extending through the second dielectric layer, the third portion having a third width; and
   a fourth portion extending through the second redistribution structure, the fourth portion having a fourth width, the fourth width being different from the third width.

6. The device of claim 5, wherein the fourth width is less than the third width.

7. The device of claim 1, further comprising:
   a first interconnect structure interposed between the first redistribution structure and the first substrate; and
   a second dielectric layer interposed between the first redistribution structure and the first interconnect structure, the second portion of the first conductive pad extending through the second dielectric layer and into the first interconnect structure.

8. A device comprising:
   a first substrate having a pixel array region in an interior of the first substrate and a peripheral region at an edge of the first substrate, the peripheral region surrounding the pixel array region;
   a plurality of photodiodes in the pixel array region of the first substrate;
   a first interconnect structure over the first substrate;
   a first dielectric layer over the first interconnect structure; and
   a first conductive pad extending through the first dielectric layer and into the first interconnect structure, the first conductive pad being disposed at the edge of the first substrate, a bottommost surface of the first conductive pad being below a topmost surface of the first interconnect structure and above a bottommost surface of the first interconnect structure, wherein the first conductive pad comprises:
      a first portion within the first dielectric layer, the first portion having a first width; and
      a second portion within the first interconnect structure, the second portion having a second width, the second width being different from the first width.

9. The device of claim 8, wherein the second width is less than the first width.

10. The device of claim 8, wherein a difference between the first width and the second width is greater than about 0.05 μm.

11. The device of claim 8, further comprising:
   a first redistribution structure interposed between the first dielectric layer and the first interconnect structure; and
   a second dielectric layer interposed between the first redistribution structure and the first interconnect structure, the first conductive pad extending through the second dielectric layer and the first redistribution structure.

12. The device of claim 8, further comprising:
   a second substrate;
   logic arrays in the second substrate;
   a second interconnect structure interposed between the second substrate and the first dielectric layer;
   a second dielectric layer interposed between the second interconnect structure and the first dielectric layer, the second dielectric layer being bonded to the first dielectric layer; and
   a second conductive pad extending through the second dielectric layer and into the second interconnect structure.

13. The device of claim 12, wherein the second conductive pad comprises:
   a third portion within the second dielectric layer, the third portion having a third width; and
   a fourth portion within the second interconnect structure, the fourth portion having a fourth width, the fourth width being less than the third width.

14. The device of claim 12, wherein the first conductive pad has a substantially same shape as the second conductive pad.

15. A device comprising:
   a first substrate;
   a first interconnect structure over the first substrate;
   a first redistribution structure over the first interconnect structure;
   a first dielectric layer over the first redistribution structure;
   a first conductive pad extending through the first dielectric layer and the first redistribution structure, and into the first interconnect structure, the first conductive pad narrowing as the first conductive pad extends through the first redistribution structure toward the first interconnect structure;
   a second dielectric layer over the first dielectric layer;
   a second redistribution structure over the second dielectric layer;
   a second interconnect structure over the second redistribution structure; and
   a second conductive pad extending through the second dielectric layer and the second redistribution structure, and into the second interconnect structure.

16. The device of claim 15, wherein the first conductive pad comprises:
   a first portion within the first redistribution structure, the first portion having a first width; and
   a second portion within the first interconnect structure, the second portion having a second width, the second width being different from the first width.

17. The device of claim 16, wherein the second width is less than the first width.

18. The device of claim 15, wherein the second conductive pad narrows as the second conductive pad extends through the second redistribution structure toward the second interconnect structure.

19. The device of claim 15, wherein the first dielectric layer is in physical contact with the second dielectric layer, and wherein the first conductive pad is in physical contact with the second conductive pad.

20. The device of claim 15, wherein the second conductive pad comprises:
   a first portion within the second redistribution structure, the first portion having a first width; and
   a second portion within the second interconnect structure, the second portion having a second width, the second width being less than the first width.

* * * * *